(12) United States Patent
Killen, Jr. et al.

(10) Patent No.: US 11,925,004 B2
(45) Date of Patent: Mar. 5, 2024

(54) DATA STORAGE COOLING MODULE

(71) Applicant: Sanmina Corporation, San Jose, CA (US)

(72) Inventors: Odie Banks Killen, Jr., Colorado Springs, CO (US); Matthew J. Babcock, Monument, CO (US); Brendan Ruggles, Colorado Springs, CO (US)

(73) Assignee: Sanmina Corporation, San Jose, CA (US)

( * ) Notice: Subject to any disclaimer, the term of this patent is extended or adjusted under 35 U.S.C. 154(b) by 174 days.

(21) Appl. No.: 17/578,313

(22) Filed: Jan. 18, 2022

(65) Prior Publication Data

US 2023/0232592 A1    Jul. 20, 2023

(51) Int. Cl.
*H05K 7/20* (2006.01)
*G06F 1/16* (2006.01)
*G06F 1/20* (2006.01)
*G11B 33/14* (2006.01)

(52) U.S. Cl.
CPC ........... *H05K 7/20563* (2013.01); *G06F 1/20* (2013.01); *G11B 33/1406* (2013.01)

(58) Field of Classification Search
CPC ............. H05K 7/20172; H05K 7/1487; H05K 7/20727; H05K 7/1489; H05K 7/20736; H05K 7/20563; H05K 7/20581; H05K 7/20136; H05K 5/026; H05K 7/20718; G06F 1/20; G11B 33/142
See application file for complete search history.

(56) References Cited

U.S. PATENT DOCUMENTS

| | | | |
|---|---|---|---|
| 6,185,097 B1 | 2/2001 | Behl | |
| 6,556,437 B1 * | 4/2003 | Hardin | H05K 7/20172 361/679.48 |
| 6,896,611 B2 | 5/2005 | Giraldo et al. | |
| 6,987,673 B1 | 1/2006 | French et al. | |
| 7,374,397 B2 * | 5/2008 | Lee | F04D 29/601 415/214.1 |
| 7,537,480 B2 * | 5/2009 | Li | G06F 1/20 439/485 |
| 7,722,359 B1 * | 5/2010 | Frangioso, Jr. | H05K 7/1445 361/679.48 |
| 8,369,092 B2 | 2/2013 | Atkins et al. | |
| 9,521,784 B1 * | 12/2016 | Huang | H05K 7/20172 |

(Continued)

OTHER PUBLICATIONS

Corresponding EP Appln. No. 23152102.2. Extended EP Search Report (dated Jun. 12, 2023).

*Primary Examiner* — Michael A Matey
(74) *Attorney, Agent, or Firm* — Daniel C. Mallery; LOZA & LOZA, LLP (57) ABSTRACT

One feature pertains to a data storage cooling module. The data storage cooling module comprises a fan cage assembly, the fan cage assembly including a fan cage that includes at least one fan bay, at least one fan assembly removably coupled to the at least one fan bay, and an interface board removably coupled to the fan cage assembly, the interface board including a first interface surface that includes at least one power connector configured to interface with the at least one fan assembly, and a second interface surface that includes at least one drive connector configured to interface with a baseboard.

20 Claims, 8 Drawing Sheets

(56) References Cited

U.S. PATENT DOCUMENTS

| | | | |
|---|---|---|---|
| 9,723,751 B2* | 8/2017 | Doglio | F16F 15/02 |
| 9,999,153 B1* | 6/2018 | Peng | G11B 33/128 |
| 10,912,216 B1 | 2/2021 | Chia et al. | |
| 11,334,127 B2* | 5/2022 | Huang | H05K 7/20145 |
| 11,456,009 B1* | 9/2022 | Liu | G11B 5/4813 |
| 11,641,726 B1* | 5/2023 | Jagadeesan | H05K 7/1417 |
| | | | 361/679.48 |
| 2001/0024358 A1* | 9/2001 | Bonet | H05K 7/20581 |
| | | | 361/695 |
| 2004/0091355 A1* | 5/2004 | Rubenstein | F04D 29/541 |
| | | | 415/213.1 |
| 2004/0130872 A1* | 7/2004 | Cravens | G06F 1/20 |
| | | | 361/695 |
| 2006/0232891 A1* | 10/2006 | Bushnik | G06F 1/20 |
| 2007/0035924 A1* | 2/2007 | Westphall | G06F 1/183 |
| | | | 361/679.48 |
| 2008/0062642 A1* | 3/2008 | Figuerado | H05K 7/20727 |
| | | | 361/695 |
| 2008/0239657 A1* | 10/2008 | Oyama | G06F 1/187 |
| 2011/0116226 A1* | 5/2011 | Yang | H05K 7/1487 |
| | | | 361/679.48 |
| 2011/0255238 A1* | 10/2011 | Tan | G06F 1/183 |
| | | | 361/679.48 |
| 2012/0057317 A1* | 3/2012 | Lin | G06F 1/20 |
| | | | 361/753 |
| 2013/0064650 A1* | 3/2013 | Wang | G06F 1/20 |
| | | | 415/182.1 |
| 2013/0155609 A1* | 6/2013 | Kuo | G06F 1/20 |
| | | | 361/679.48 |
| 2013/0160984 A1* | 6/2013 | Cash | H05K 7/20736 |
| | | | 165/200 |
| 2014/0016265 A1* | 1/2014 | Saito | G06F 1/183 |
| | | | 361/679.48 |
| 2014/0364048 A1* | 12/2014 | Milligan | H05K 7/20581 |
| | | | 454/184 |
| 2015/0177750 A1* | 6/2015 | Bailey | G05D 23/1932 |
| | | | 700/275 |
| 2016/0041590 A1* | 2/2016 | Yu | G06F 1/186 |
| | | | 361/679.32 |
| 2017/0086332 A1* | 3/2017 | Jaskela | H05K 7/1487 |
| 2017/0202111 A1* | 7/2017 | Huang | H05K 7/1487 |
| 2018/0100512 A1 | 4/2018 | Chen et al. | |
| 2018/0120909 A1* | 5/2018 | Yang | G06F 1/189 |
| 2019/0073006 A1* | 3/2019 | Chang | G06F 1/206 |
| 2019/0200481 A1* | 6/2019 | Avvaru | G11B 33/142 |
| 2020/0301618 A1* | 9/2020 | Olarig | G06F 3/067 |
| 2020/0344909 A1* | 10/2020 | Liu | H05K 7/1487 |
| 2021/0007236 A1* | 1/2021 | Wu | G11B 33/126 |
| 2021/0026428 A1* | 1/2021 | Olarig | G06F 1/3228 |
| 2021/0116978 A1* | 4/2021 | Yu | H05K 7/20172 |
| 2023/0016259 A1* | 1/2023 | Zhong | G06F 1/183 |

* cited by examiner

DATA STORAGE COOLING MODULE

FIELD

This application relates to data storage systems and, in particular, to retrofit data storage cooling modules for use in data storage systems.

BACKGROUND

Data storage systems that store hard drives often employ fans which cool the stored hard drives to maintain hard drive performance. The number of fans used in such data storage systems and fan speed are often a factor of the expected thermal output expected from the hard drives. Efforts to improve hard drive performance may include replacing hard drives with higher capacity hard drives (e.g., multi-actuator hard drives). As an example, higher capacity hard drives may have a higher power load than what data storage systems are originally designed for. Using higher capacity hard drives may also increase the amount of heat within data storage systems and often requires improved cooling mechanisms. However, adding more fans than originally provisioned within a data storage systems is typically not easily achievable due to the original data storage system design which may have specific fan arrangements. To cool higher capacity hard drives without additional fans, existing components in data storage systems may need to be repurposed. As such, there is a need for a way to repurpose existing data storage systems to accept high capacity disk drives while still providing adequate cooling to those high capacity disk drives.

SUMMARY

The following presents a simplified summary of one or more implementations in order to provide a basic understanding of some implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

According to one feature, a data storage cooling module is provided. The data storage cooling module comprises a fan cage assembly, the fan cage assembly including a fan cage that includes at least one fan bay, at least one fan assembly removably coupled to the at least one fan bay, and an interface board removably coupled to the fan cage assembly, the interface board including a first interface surface that includes at least one power connector configured to interface with the at least one fan assembly, and a second interface surface that includes at least one drive connector configured to interface with a baseboard.

According to one aspect, the fan cage includes a first fan bay, wherein a first surface of the first fan bay includes two adjacent openings and a second surface of the first fan bay, which opposes the first surface of the first fan bay, includes two adjacent openings, and a second fan bay, wherein a first surface of the second fan bay includes two adjacent openings and a second surface of the second fan bay, which opposes the first surface of the second fan bay, includes two adjacent openings.

According to another aspect, the two adjacent openings of the first surface of the first fan bay, the two adjacent openings of the second surface of the first fan bay, the two adjacent openings of the first surface of the second fan bay, and the two adjacent openings of the second surface of the second fan bay are each circular openings.

According to yet another aspect, the two adjacent openings of the first surface of the first fan bay, the two adjacent openings of the second surface of the first fan bay, the two adjacent openings of the first surface of the second fan bay, and the two adjacent openings of the second surface of the second fan bay are each spaced apart by equal distances.

According to yet another aspect, the fan cage assembly includes a first fan assembly removably coupled to a first fan bay, the first fan assembly including two adjacent fan modules that align with two adjacent openings of the first fan bay, and a second fan assembly removably coupled to a second fan bay, the second fan assembly including two adjacent fan modules that align with adjacent openings of the second fan bay.

According to yet another aspect, the first fan bay and the first fan assembly are symmetric with the second fan bay and the second fan assembly.

According to yet another aspect, the interface board includes a first power connector and a second power connector mounted on the first interface surface, wherein the first power connector connects to a first fan assembly and the second power connector connects to a second fan assembly, and wherein the first power connector has a means for powering and controlling the first fan assembly and the second power connector has a means for powering and controlling the second fan assembly.

According to yet another aspect, the interface board includes a first drive connector and a second drive connector mounted on the second interface surface, and wherein the first drive connector and the second drive connector have a means for interfacing with the baseboard.

According to yet another aspect, the interface board includes a series of circuits to carry signals between the at least one drive connector and the at least one power connector.

According to yet another aspect, the interface board is an industry standard hard drive disk (HDD) connector.

According to yet another aspect, the interface board is a U.3 drive connector, and wherein unused connector pins provide fan control and power to the at least one fan assembly.

According to yet another aspect, the interface board is capable of at least one of a small computer systems interface (SCSI) and a serial advanced technology attachment (SATA) drive connectivity.

According to yet another aspect, the at least one fan assembly is hot swappable.

According to yet another aspect, the fan cage assembly can be replaced with hard drives that connect to the interface board.

According to another feature, an interface board for a data storage cooling module is provided. The interface board for the data storage cooling module comprises a first interface surface and a second interface surface that is opposite of the first interface surface, a first power connector mounted on the first interface surface for powering at least one of a first fan assembly and a first hard drive, a second power connector mounted on the first interface surface for powering at least one of a second fan assembly and a second hard drive, and a first drive connector and a second drive connector mounted on the second interface surface for interfacing with a baseboard.

According to yet another feature, a data storage system is provided. The data storage system comprises a data storage rack that includes a plurality of drive bays, a baseboard that includes a plurality of drive connectors corresponding to the plurality of drive bays, a data storage cooling module removably coupled to the data storage rack through a first subset of the plurality of drive connectors, and a plurality of hard drives removably coupled to the data storage rack through a second subset of the plurality of drive connectors.

According to one aspect, the data storage cooling module includes a fan cage assembly, the fan cage assembly including a fan cage that includes at least one fan bay, at least one fan assembly removably coupled to the at least one fan bay, and an interface board removably coupled to the fan cage assembly, the interface board including a first interface surface that includes at least one power connector configured to interface with the at least one fan assembly, and a second interface surface that includes at least one drive connector configured to interface with the baseboard.

According to another aspect, the data storage cooling module is removably coupled to the data storage rack via a latch.

According to yet another aspect, data storage cooling module occupies at least one drive bay without changing an infrastructure of the data storage system.

According to yet another aspect, the plurality of hard drives are at least one of single-actuator hard drives and multi-actuator hard drives.

BRIEF DESCRIPTION OF THE DRAWINGS

Throughout the description, similar reference numbers may be used to identify similar elements.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details.

The word "exemplary" or "embodiment" is used herein to mean "serving as an example, instance, or illustration." Any implementation or aspect described herein as "exemplary" or as an "embodiment" is not necessarily to be construed as preferred or advantageous over other aspects of the disclosure. Likewise, the term "aspects" does not require that all aspects of the disclosure include the discussed feature, advantage, or mode of operation.

Embodiments will now be described in detail with reference to the accompanying drawings. In the following description, numerous specific details are set forth in order to provide a thorough understanding of the aspects described herein. It will be apparent, however, to one skilled in the art, that these and other aspects may be practiced without some or all of these specific details. In addition, well known steps in a method of a process may be omitted from flow diagrams presented herein in order not to obscure the aspects of the disclosure. Similarly, well known components in a device may be omitted from figures and descriptions thereof presented herein in order not to obscure the aspects of the disclosure.

Overview

The present disclosure is directed to improving the serviceability and implementation of fans in data storage systems. More specifically, a data storage cooling module with hot swappable fan assemblies and a repurposed interface board that can be implemented in standard drive cage assemblies is addressed.

According to one aspect, a data storage cooling module may include a fan cage assembly and an interface board removably coupled to the fan cage assembly. The fan cage assembly may include a fan cage that includes at least one fan bay and at least one fan assembly removably coupled to the at least one fan bay. Additionally, the interface board may include a first interface surface that includes at least one power connector configured to interface with the at least one fan assembly, and a second interface surface that includes at least one drive connector configured to interface with a baseboard.

Data Storing Cooling Module

Figure 1A:
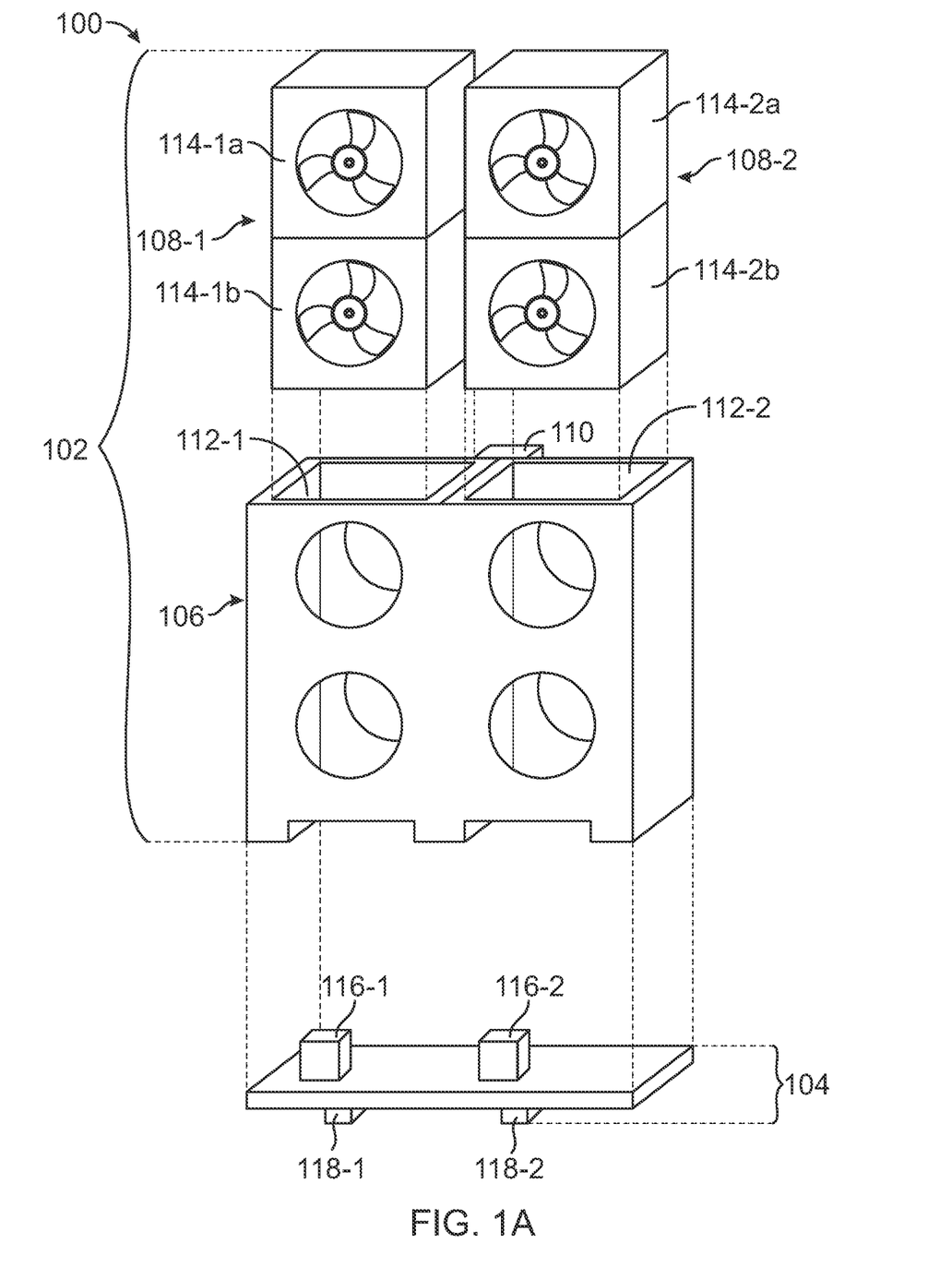
FIG. 1A depicts an isometric view of components included in a data storage cooling module.

FIG. 1A depicts an isometric view of components included in a data storage cooling module 100. As shown, the data storage cooling module 100 includes a fan cage assembly 102 and an interface board 104.

The fan cage assembly 102 includes a fan cage 106, a first fan assembly 108-1, and a second fan assembly 108-2.

The fan cage 106 includes a latch 110, a first fan bay 112-1, to which the first fan assembly 108-1 is removably coupled, and a second fan bay 112-2, to which the second fan assembly 108-2 is removably coupled. As an example, "removably coupled" may imply that a component (e.g., a fan assembly or an interface board) may be mounted and/or dismounted to another corresponding component (e.g., a fan bay or a fan cage). The latch 110 may be used to mount the data storage cooling module in a data storage system (not shown) and will be further described with reference to FIG. 6. In an embodiment, the first fan bay 112-1 and the second fan bay 112-2 are adjacent and aligned in parallel to each other. The first fan bay 112-1 and the first fan assembly 108-1 may also be symmetric with the second fan bay 112-2 and the second fan assembly 108-2. In an embodiment, the fan cage 106 may be made of a plastic, a metal, a composite material, or any combination thereof. Additionally, the fan cage 106 may have a length greater than 80 millimeters (mm), a width greater than 20 mm, and a height greater than 100 mm.

Additionally, the fan cage 106 includes a top opening of the first fan bay 112-1 and a bottom opening of the first fan bay 112-1, and a top opening of the second fan bay 112-2 and a bottom opening of the second fan bay 112-2. As an example, each top opening and each bottom opening may be located in parallel at the top and bottom of the fan cage 106 (e.g., directly above/below each other). In such an example, the top opening(s) and the bottom opening(s) may each be rectangular openings and may be large enough for a fan assembly (e.g., the first fan assembly 108-1 or the second fan assembly 108-2) to mount in. Furthermore, a first surface of the first fan bay 112-1 includes two adjacent openings and a second surface of the first fan bay 112-1, which opposes the first surface of the first fan bay 112-1, includes two adjacent openings. Similarly, a first surface of the second fan bay 112-2 includes two adjacent openings and a second surface of the second fan bay 112-2, which opposes the first surface of the second fan bay 112-2, includes two adjacent openings. As an example, each of the two adjacent openings of the first and second surfaces may be circular openings and may be aligned in parallel with each other to allow a passage for airflow. Additionally, each of the two adjacent openings of the first and second surfaces may be symmetric and spaced apart by (nearly) equal distances. Although each of the two adjacent openings are shown in FIG. 1A as being circular, each of the two adjacent openings are not limited to being circular and may resemble other shapes.

The first fan assembly 108-1 includes two adjacent fan modules 114-1a and 114-1b, and the second fan assembly 108-2 includes two adjacent fan modules 114-2a and 114-2b. As an example, each of the two adjacent fan modules of the first fan assembly 108-1 and/or the second fan assembly 108-2 may be connected to form a singular unit. In an embodiment, the first fan assembly 108-1 and/or the second fan assembly 108-2 may operate independent of each other and may be "hot swappable", allowing improved serviceability of the data storage cooling module 100. As described herein, "hot swappable" may imply that a component (e.g., a fan assembly) can be interchanged, replaced, removed, etc., without disrupting or interrupting operations of the data storage cooling module 100. When a fan assembly (e.g., the first fan assembly 108-1 or the second fan assembly 108-2) is mounted inside a fan bay (e.g., the first fan bay 112-1 or the second fan bay 112-2), each of the two fan modules align with each of the two adjacent openings of, for example, the first fan bay 112-1 and/or the second fan bay 112-2. By aligning each of the two adjacent fan modules with each of the two adjacent openings, the fan assembly can direct airflow through the data storage cooling module 100.

As an example, a fan assembly (e.g., the first fan assembly 108-1 or the second fan assembly 108-2) may have a length greater than 40 mm, a width greater than 20 mm, and a height greater than 100 mm and may be made of a plastic, a metal, a composite material, or any combination thereof. Furthermore, a fan assembly (e.g., the first fan assembly 108-1 or the second fan assembly 108-2) may use, for example, 130±20 watts (W) of power. In addition, by including a total of four fan modules (e.g., fan modules 114-1a, 114-1b, 114-2a, and 114-2b), the data storage cooling module 100 allows for increased air pressure and airflow. Although the fan cage assembly 102 is shown as including four fan modules, the fan cage assembly 102 may also include more than four fan modules or less than four fan modules.

The interface board 104 includes a first power connector 116-1 and a second power connector 116-2 for powering the first fan assembly 108-1 and the second fan assembly 108-2, respectively. The first power connector 116-1 and the second power connector 116-2 are positioned on the interface surface to align with the first fan bay 112-1 and the second fan bay 112-2, respectively. Additionally, the interface board 104 includes a first drive connector 118-1 and a second drive connector 118-2 for interfacing with a baseboard (not shown). The first power connector 116-1 and the second power connector 116-2 are mounted on a first interface surface, and the first drive connector 118-1 and the second drive connector 118-2 are mounted on a second interface surface that is opposite of the first interface surface.

The interface board 104 is removably coupled to the fan cage assembly 102. In an embodiment, the interface board may be an industry standard hard drive disk (HDD) connector. For example, the interface board 104 may be a U.3 drive connector where unused U.3 drive connector pins are repurposed to provide fan control and power. Additionally, the interface board may still allow full serial attached small computer systems interface (SCSI) (SAS) or serial advanced technology attachment (SATA) drive connectivity. The interface board 104 may also include a series of circuits (not shown) to carry signals between the first drive connector 118-1 and the first power connector 116-1, and/or between the second drive connector 118-2 and the second power connector 116-2. As an example, the power connectors may connect to the fan modules via a wired connection and the drive connectors may connect to the baseboard via a wired connection. In such an example, the baseboard may be a motherboard or other similar controller that provides power to the data storage cooling module 100 and controls the first fan assembly 108-1 and the second fan assembly 108-2 via the interface board 104. As an example, the interface board may have a length greater than 80 mm, a width greater than 20 mm, and a height greater than 5 mm.

Figure 1B:
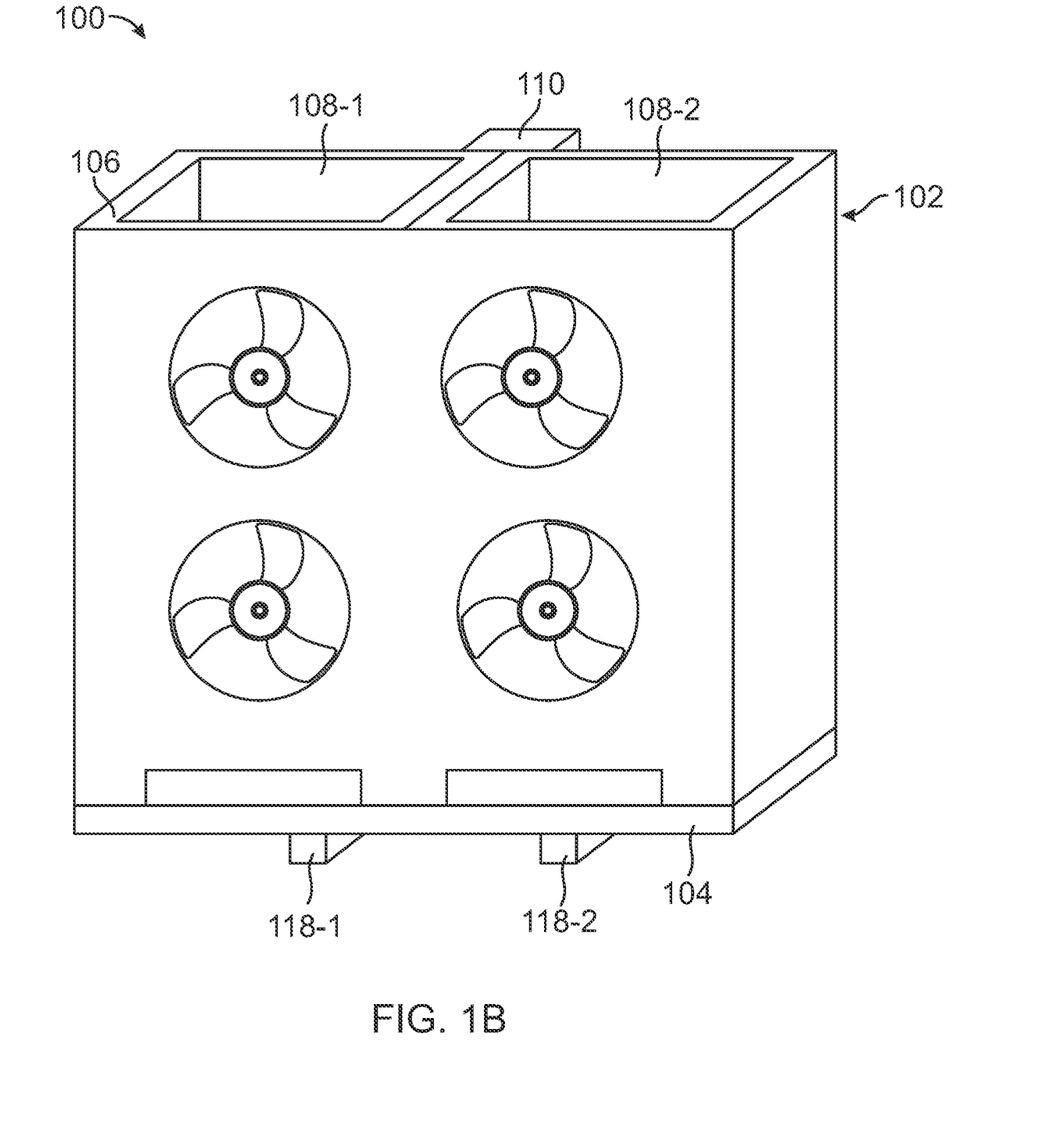
FIG. 1B depicts an isometric view of the data storage cooling module of FIG. 1A.

FIG. 1B depicts an isometric view of the data storage cooling module 100 of FIG. 1A. The embodiment of FIG. 1B shows the data storage cooling module with each of its components mounted into place. As shown, the data storage cooling module includes the fan cage assembly 102 with the fan cage 106, the latch 110, the first fan assembly 108-1, and the second fan assembly 108-2, as well as the interface board 104 with the first drive connector 118-1 and the second drive connector 118-2, each of which are implemented as previously described with reference to FIG. 1A. Additionally, the interface board 104 includes the first power connector (not shown) and the second power connector (not shown) which connect to the first fan assembly 108-1 and the second fan assembly 108-2 as described with reference to FIG. 1A. In an embodiment, the data storage cooling module 100 may have a length greater than 80 mm, a width greater than 20 mm, and a height greater than 105 mm.

In some embodiments, a data storage cooling module includes a fan cage assembly and an interface board removably coupled to the fan cage assembly as previously described with reference to FIG. 1A and FIG. 1B. The fan cage assembly includes a fan cage that includes at least one fan bay and at least one fan assembly removably coupled to the at least one fan bay. Additionally, the interface board includes a first interface surface that includes at least one power connector configured to interface with the at least one fan assembly, and a second interface surface that includes at least one drive connector configured to interface with a baseboard. As an example, the interface board is a repurposed interface board which may be used to allow the data storage cooling module to be implemented in drive bays of a data storage system.

Exemplary Embodiments of a Data Storing Cooling Module

In some embodiments, a data storage system may include hard drives mounted in drive bays of an HDD cage and additional infrastructure for fans which cool the data storage system. As an example, the data storage system may include 102 10 W hard drives (e.g., single-actuator hard drives) that occupy 102 drive bays. In the last row of the data storage system, one segment of drive bays may include five drive bays for five hard drives and another segment of drive bays may include six drive bays for six hard drives. However, by replacing the hard drives included in the last row of the data storage system with two data storage cooling modules, the 91 remaining 10 W hard drives can be replaced with 91 14 W hard drives (e.g., multi-actuator hard drives). In such an example, one data storage cooling module may occupy five drive bays and the other data storage cooling module may include a spacer (e.g., extra piece of material) so that it occupies six drive bays. In combination with the two data storage cooling modules, implementing the 14 W hard drives enables, for example, a 40% increase in drive power per slot without additional changes to the mechanical structure of the data storage system. Thus, multi-actuator hard drives may be implemented in a data storage system originally designed for lower wattage, single-actuator hard drives without a decrease in hard drive performance and/or an increase in the overall temperature of the data storage system.

Other exemplary implementations of a data storage cooling module may include, but are not limited to, the data storage cooling module occupying one or more drive bays of a data storage system, the data storage cooling module allowing for other higher capacity hard drives in a data storage system, and/or the data storage cooling module being implemented at the top, bottom, side, or any combination thereof, of a data storage system.

Interface Board of a Data Storing Cooling Module

Figure 2A:
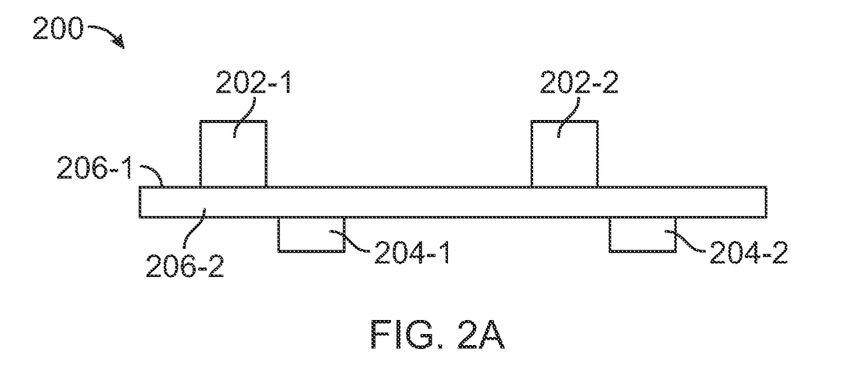
FIG. 2A depicts a side perspective view of an interface board.

FIG. 2A depicts a side perspective view of an interface board 200. The interface board 200 may have similar functionality as those shown in FIGS. 1A-1B. The interface board 200 includes a first power connector 202-1 and a second power connector 202-2 that are mounted on a first interface surface 206-1. Additionally, the interface board 200 includes a first drive connector 204-1 and a second drive connector 204-2 that are mounted on a second interface surface 206-2 that is opposite of the first interface surface 206-1. By having interface surfaces opposite of each other, the interface board 200 can connect to fan assemblies (e.g., the first fan assembly 108-1 and/or the second fan assembly 108-2) on the first interface surface 206-1 and can interface with a baseboard (not shown) on the second interface surface 206-2 without experiencing structural interference. Although the interface board 200 is shown as including two power connectors and two drive connectors, the interface board may include more than two power connectors and/or drive connectors.

Figure 2B:
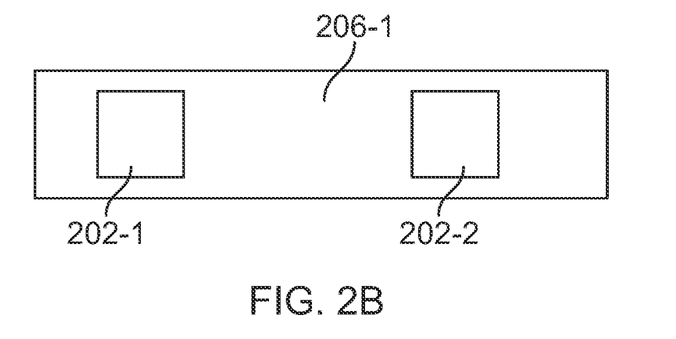
FIG. 2B depicts a top perspective view of the interface board of FIG. 2A.

FIG. 2B depicts a top perspective view of the interface board 200 of FIG. 2A. As shown, the interface board includes the first power connector 202-1 and the second power connector 202-2 that are mounted on the first interface surface 206-1 as described with reference to FIG. 2A. The first power connector 202-1 and the second power connector 202-2 may be positioned on the first interface surface 206-1 such that the positioning allows the first power connector 202-1 and the second power connector 202-2 to connect to fan assemblies (e.g., the first fan assembly 108-1 and the second fan assembly 108-2). Additionally, the first power connector 202-1 and the second power connector 202-2 may be positioned on the first interface surface 206-1 such that the positioning allows the interface board to be removably coupled to a fan cage assembly (e.g., fan cage assembly 102).

Figure 2C:
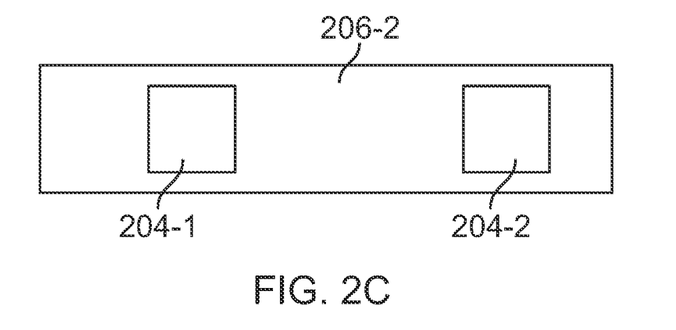
FIG. 2C depicts a bottom perspective view of the interface board of FIG. 2A.

FIG. 2C depicts a bottom perspective view of the interface board 200 of FIG. 2A. As shown, the interface board includes the first drive connector 204-1 and the second drive connector 204-2 that are mounted on the second interface surface 206-2 as described with reference to FIG. 2A. The first drive connector 204-1 and the second drive connector 204-2 may be positioned on the second interface surface 206-2 such that the positioning allows the first drive connector 204-1 and the second drive connector 204-2 to connect to a baseboard. Additionally, the first drive connector 204-1 and the second drive connector 204-2 may be positioned on the second interface surface 206-2 such that the positioning allows the interface board to be mounted in a data storage system (e.g., an HDD cage infrastructure).

Fan Cage Assembly of a Data Storing Cooling Module

Figure 3A:
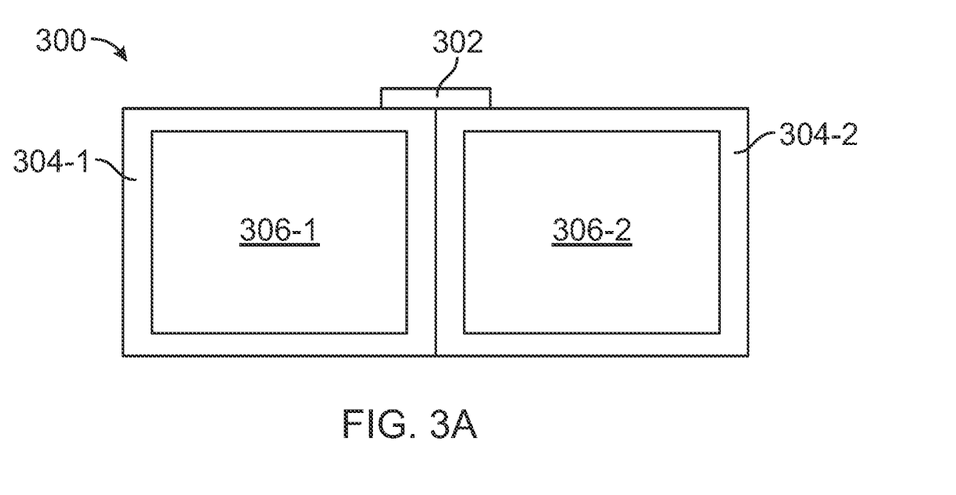
FIG. 3A depicts a top perspective view of a fan cage assembly.

FIG. 3A depicts a top perspective view of a fan cage assembly 300. The fan cage assembly 300 may have similar functionality as those shown in FIGS. 1A-1B. The fan cage assembly 300 includes a latch 302. The fan cage assembly 300 also includes a first fan bay 304-1 and a second fan bay 304-2 that are adjacent to each other. By having the first fan bay 304-1 and the second fan bay 304-2 adjacent to each other, the fan cage assembly 300 can occupy one or more drive bays in a data storage system. Additionally, the fan cage assembly 300 includes a first fan assembly 306-1 removably coupled to the first fan bay 304-1 and a second fan assembly 306-2 removably coupled to the second fan bay 304-2. By having the first fan assembly 306-1 and the second fan assembly 306-2 removably coupled to separate fan bays (e.g., the first fan bay 304-1 and the second fan bay 304-2), a data storage cooling module (e.g., data storage cooling module 100) may have improved serviceability of the fan assemblies as one or both of the fan assemblies can be replaced without disrupting or interrupting operations performed by the data storage cooling module. Furthermore, although the fan assemblies and the fan bays are shown as being symmetric, the fan assemblies and fan bays are not limited to being symmetric.

Figure 3B:
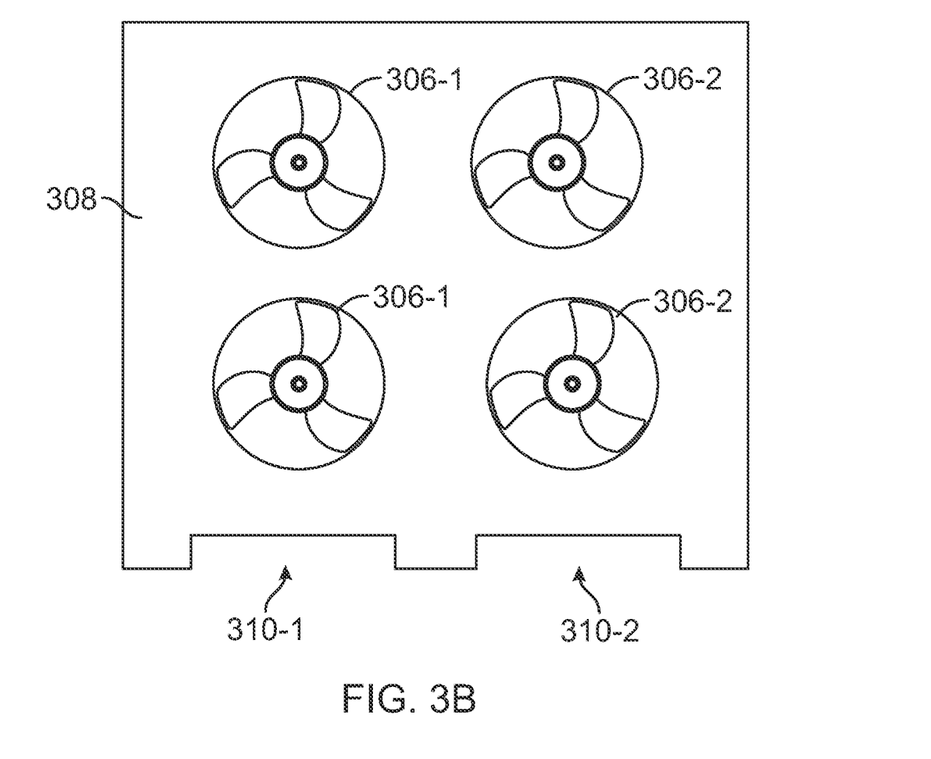
FIG. 3B depicts a front perspective view of the fan cage assembly of FIG. 3A.

FIG. 3B depicts a front perspective view of the fan cage assembly 300 of FIG. 3A. As shown, the fan cage assembly includes a fan cage 308 as well as the first fan assembly 306-1 and the second fan assembly 306-2 mounted in the fan cage 308. The first fan assembly 306-1 and the second fan assembly 306-2 are mounted in the fan cage 308, such that two adjacent fan modules of each fan assembly are aligned with two adjacent openings of the fan cage 308. Additionally, the fan cage assembly includes a first cutout 310-1 and a second cutout 310-2 on a bottom edge of the fan cage 308. The first cutout 310-1 and the second cutout 310-2 may be centrally aligned directly below the first fan assembly 306-1 and the second fan assembly 306-2, respectively. As an example, the first cutout 310-1 and the second cutout 310-2 may each resemble a rectangular shape. Furthermore, the front perspective view may also be representative of a rear perspective view of the fan cage assembly, such that features of the front perspective view and features of the rear perspective view may be similar or the same.

Exemplary Implementations

Figure 4:
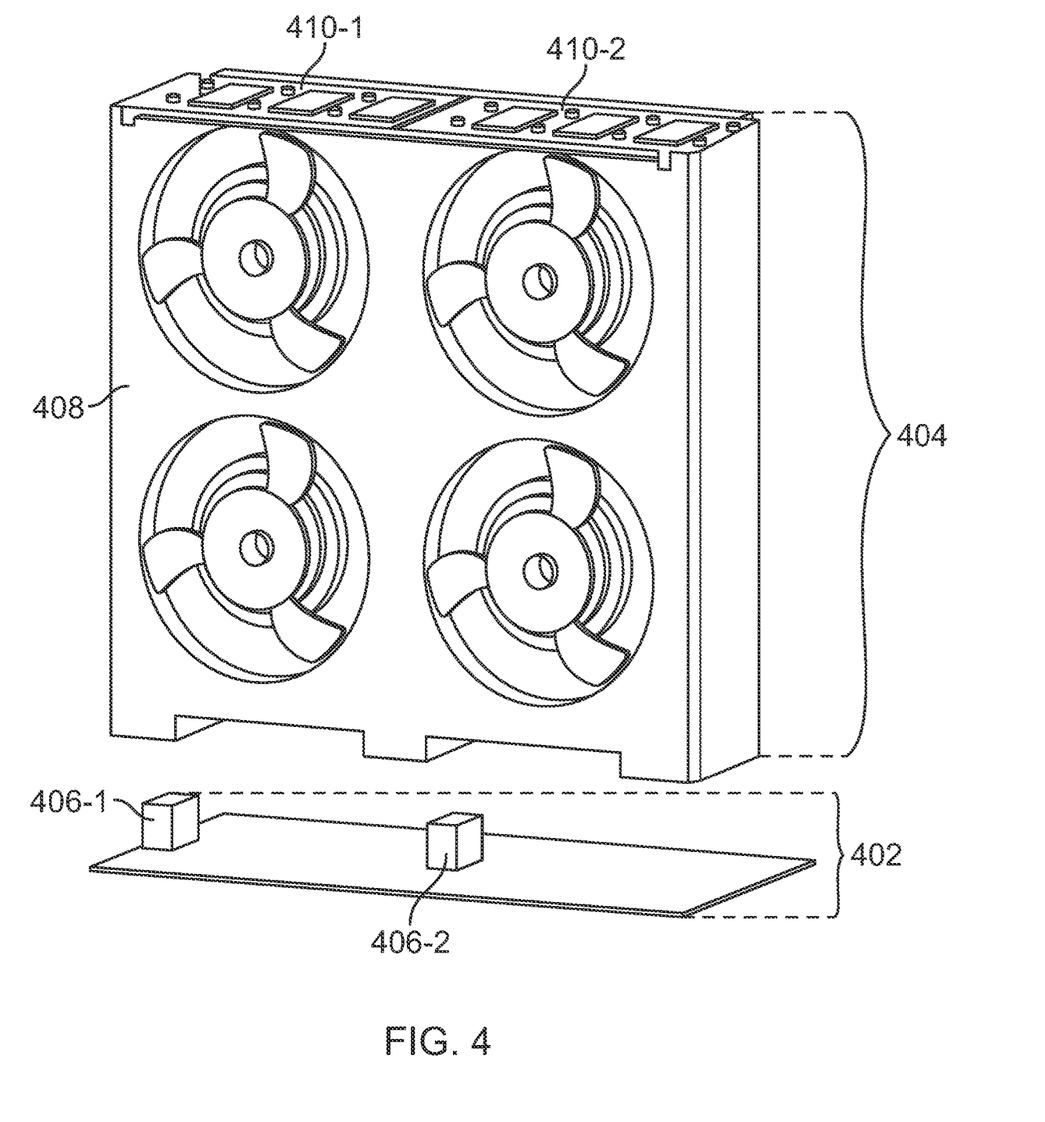
FIG. 4 depicts an interface board separate from a fan cage assembly.

FIG. 4 depicts an interface board 402 separate from a fan cage assembly 404. The interface board 402 may have similar functionality as those shown in FIGS. 1A-1B and FIGS. 2A-2B. The fan cage assembly 404 may have similar functionality as those shown in FIGS. 1A-1B and FIGS. 3A-3B.

Techniques for dismounting/mounting the interface board 402 from/to the fan cage assembly 404 are described herein. As an example, the interface board 402 may be dismounted from the fan cage assembly 404 by disconnecting a first power connector 406-1 from a first fan assembly 410-1 and/or a second power connector 406-2 from a second fan assembly 410-2, and/or by dismounting the interface board 402 from a fan cage 408. As another example, the interface board 402 may be mounted to the fan cage assembly 404 by connecting the first power connector 406-1 to the first fan assembly 410-1 and/or the second power connector 406-2 to the second fan assembly 410-2, and/or by mounting the interface board 402 to the fan cage 408. By allowing the fan cage assembly 404 to be dismounted/mounted from/to the interface board 402, the fan cage assembly 404 and/or the interface board 402 may be easily replaced or serviced.

Figure 5:
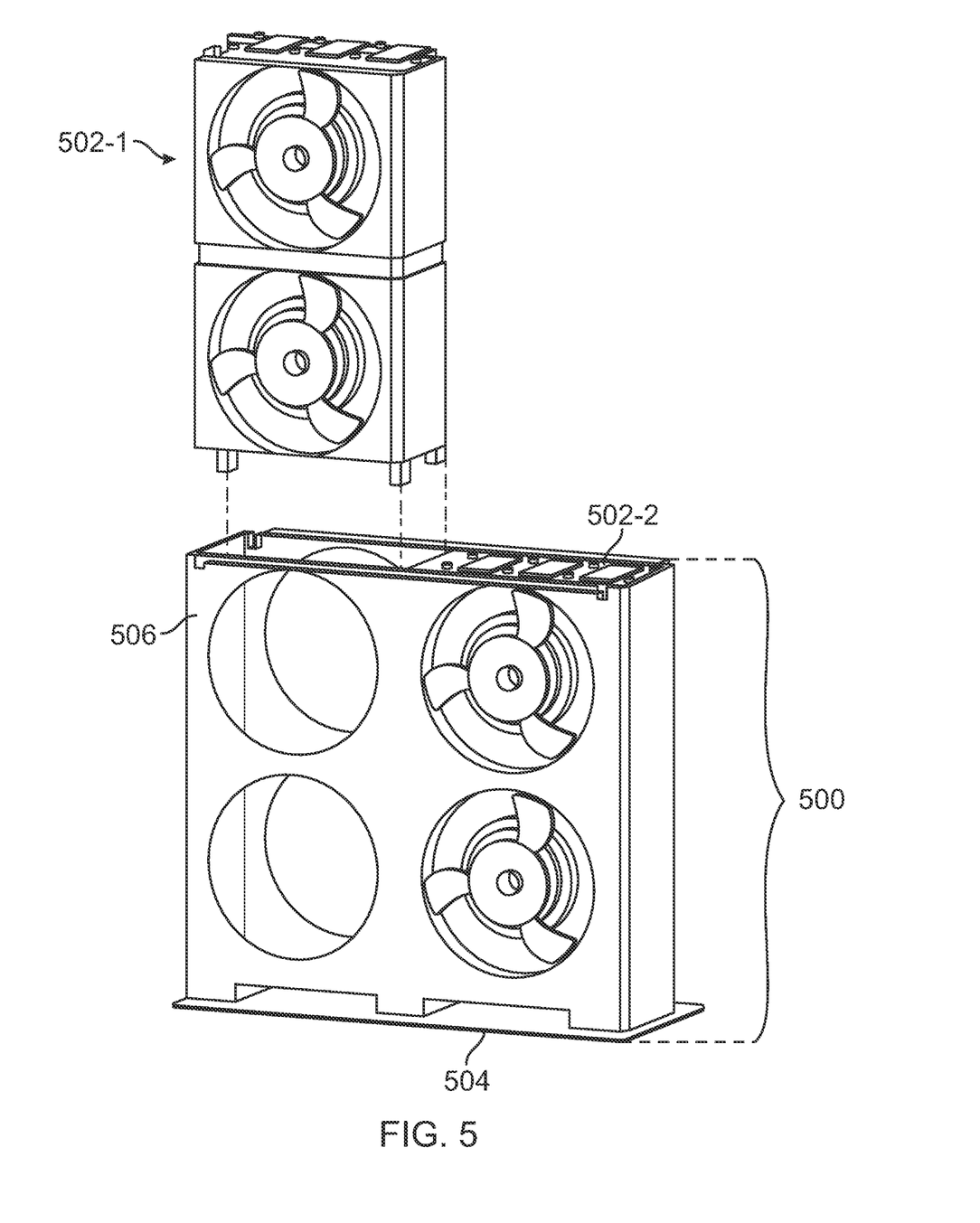
FIG. 5 depicts a fan assembly separate from a data storage cooling module.

FIG. 5 depicts a first fan assembly 502-1 separate from a data storage cooling module 500, and a second fan assembly 502-2 mounted to the data storage cooling module 500. The fan assemblies 502-1 and 502-2 may have similar functionality as those shown in FIGS. 1A-1B and FIGS. 3A-3B. The data storage cooling module 500 may have similar functionality as those shown in FIGS. 1A-1B.

Techniques for dismounting/mounting the first fan assembly 502-1 from/to the data storage cooling module 500 are described herein. As an example, the first fan assembly 502-1 may be dismounted from the data storage cooling module 500 by disconnecting the first fan assembly 502-1 from an interface board 504 and/or by dismounting the first fan assembly 502-1 from a fan cage 506. As another example, the first fan assembly 502-1 may be mounted to the data storage cooling module 500 by connecting the first fan assembly 502-1 to the interface board 504 and/or by mounting the first fan assembly 502-1 to the fan cage 506 (e.g., as shown by the second fan assembly 502-2). By allowing the first fan assembly 502-1 to be dismounted/mounted from/to the data storage cooling module 500, the first fan assembly 502-1 may be easily replaced or serviced.

Figure 6:
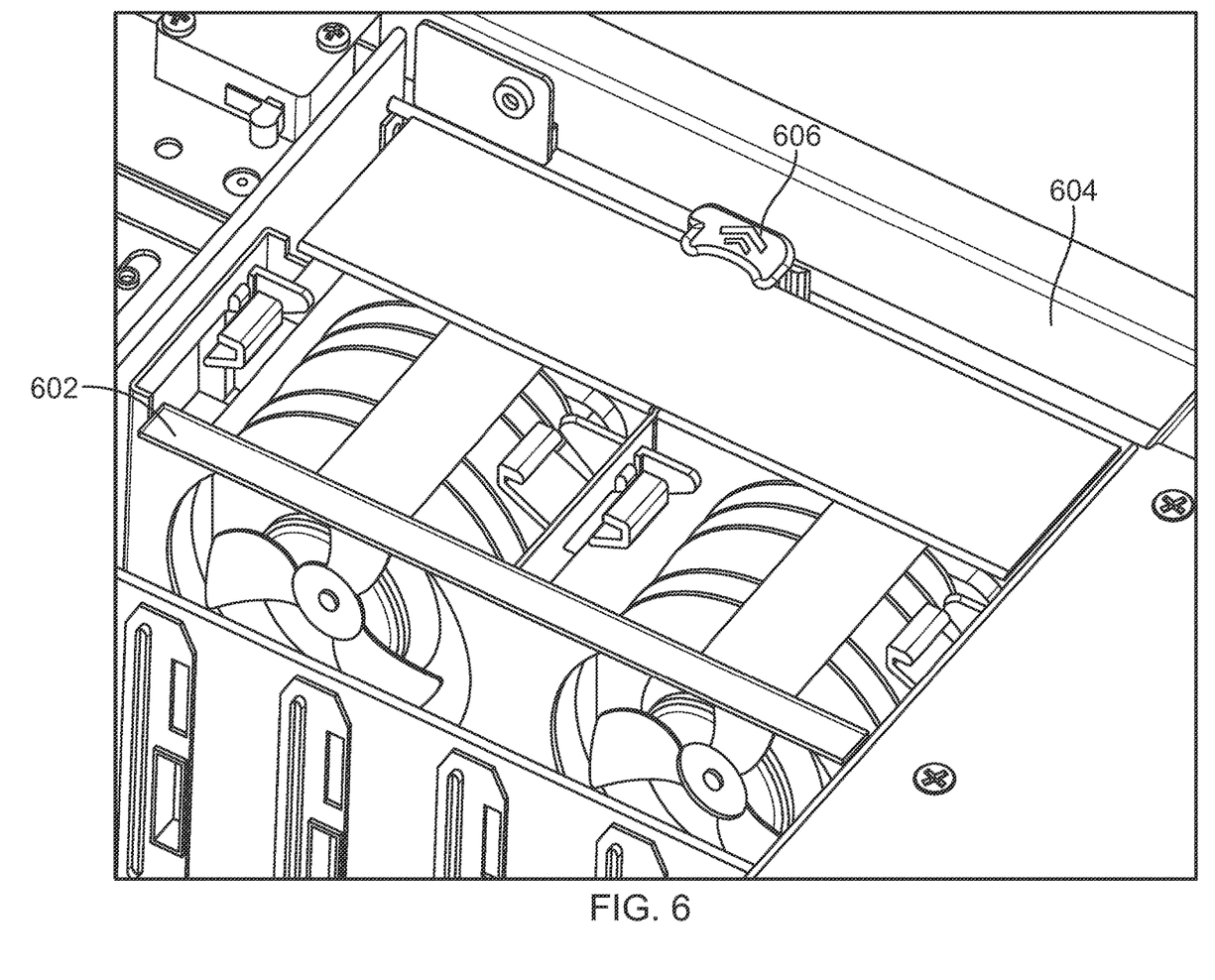
FIG. 6 depicts an isometric bottom perspective view of a data storage cooling module removably coupled to a data storage system.

FIG. 6 depicts an isometric bottom perspective view of a data storage cooling module 602 removably coupled to a data storage system 604. The data storage cooling module 602 may have similar functionality as those shown in FIGS. 1A-1B. As shown, the data storage cooling module 602 is removably coupled to the data storage system 604 via a latch 606. In an embodiment, the latch 606 may help lock the data storage cooling module 602 into place within the data storage system 604 by pressing against an inner edge of the data storage system 604. As an example, the latch 606 may press against the inner edge of the data storage system 604 via a spring, a notch, or other mechanical mechanism. Additionally, the latch 606 may allow the data storage cooling module 602 to be dismounted from the data storage system 604. For example, pressing the latch 606 in a predetermined direction may dismount the data storage cooling module 602 from its position in the data storage system 604, allowing the data storage cooling module 602 to be removed. Although the data storage cooling module 602 is shown as including one latch, the data storage cooling module 602 may also include more than one latch. Furthermore, although the data storage cooling module 602 is described as being removably coupled to the data storage system 604 via the latch 606, the data storage cooling module 602 may also be removably coupled to the data storage system 604 via other coupling mechanisms.

Figure 7:
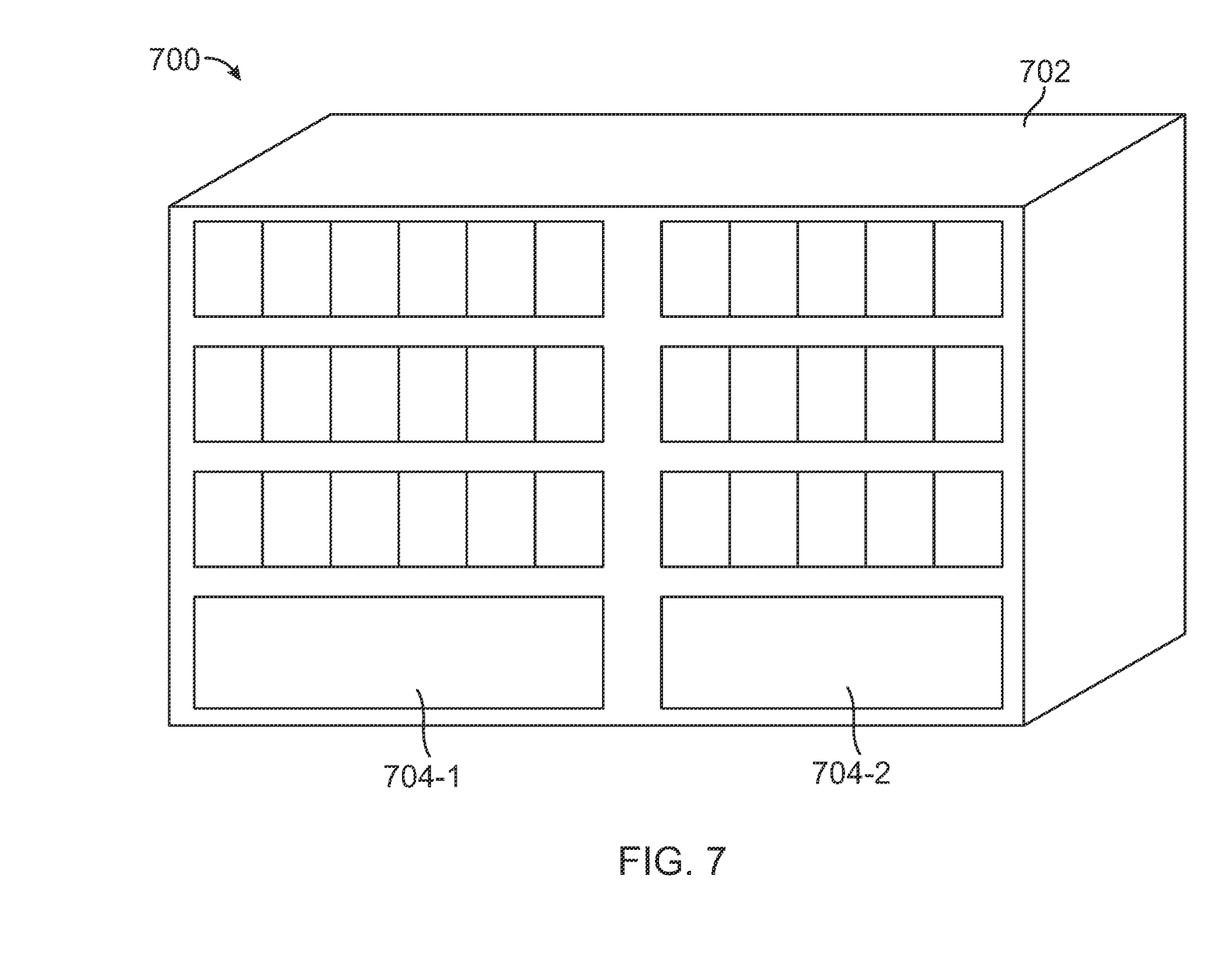
FIG. 7 depicts an isometric view of components included in a data storage system.

FIG. 7 depicts an isometric view of components included in a data storage system 700. As shown, the data storage system 700 includes a data storage rack 702, a first data storage cooling module 704-1, a second data storage cooling module 704-2, and a plurality of hard drives. The data storage system 700 also includes a baseboard (not shown) that includes a plurality of drive connectors (not shown).

The data storage rack 702 includes four rows of drive bays across two columns. A first column is shown as including six drive bays with six hard drives in three rows and the first data storage cooling module 704-1 in one row. A second column is shown as including five drive bays with five hard drives in three rows and the second data storage cooling module 704-2 in one row. In an embodiment, the hard drives included in the data storage system 700 are removably coupled to the data storage rack 702. Although the data storage rack 702 is shown as including six drive bays with six hard drives in three rows of the first column and five drive bays with five hard drives in three rows of the second column, the data storage rack 702 may include more or less drive bays with more or less hard drives in more or less rows and more or less columns.

The first data storage cooling module 704-1 and the second data storage cooling module 704-2 may have similar functionality as those shown in FIGS. 1A-1B. In an embodiment, the first data storage cooling module 704-1 and the second data storage cooling module 704-2 are removably coupled to the data storage rack 702. As an example, the data storage cooling modules 704-1 and 704-2 include fan assemblies that are positioned perpendicular to the hard drives included in the data storage rack 702. By having the fan assemblies positioned perpendicular to the hard drives, air outputted by the fan assemblies can flow through the data storage system 700 to cool the hard drives. Additionally, although the data storage system 700 is shown as including two data storage cooling modules 704-1 and 704-2, the data storage system 700 may include less than two or more than two data storage cooling modules.

In some embodiments, a data storage system includes a data storage rack, a baseboard, a data storage cooling module, and a plurality of hard drives as previously described with reference to FIG. 7. The data storage rack includes a plurality of drive bays, and the baseboard includes a plurality of drive connectors corresponding to the plurality of drive bays. Additionally, the data storage cooling module and the plurality of hard drives are each removably coupled to the data storage rack through the plurality of drive connectors. For example, the data storage cooling module is removably coupled to the data storage rack through a first subset of the plurality of drive connectors and the plurality of hard drives are removably coupled to the data storage rack through a second subset of the plurality of drive connectors. Furthermore, the data storage cooling module includes a fan cage assembly and an interface board removably coupled to the fan cage assembly. The fan cage assembly includes a fan cage that includes at least one fan bay and at least one fan assembly removably coupled to the at least one fan bay. Additionally, the interface board includes a first interface surface that includes at least one power connector configured to interface with the at least one fan assembly, and a second interface surface that includes at least one drive connector configured to interface with the baseboard.

As may be used herein, the term "operable to" or "configurable to" indicates that an element includes one or more of components, attachments, circuits, instructions, modules, data, input(s), output(s), etc., to perform one or more of the described or necessary corresponding functions and may further include inferred coupling to one or more other items to perform the described or necessary corresponding functions. As may also be used herein, the term(s) "coupled", "coupled to", "connected to" and/or "connecting" or "interconnecting" includes direct connection or link between nodes/devices and/or indirect connection between nodes/devices via an intervening item (e.g., an item includes, but is not limited to, a component, an element, a circuit, a module, a node, device, network element, etc.). As may further be used herein, inferred connections (i.e., where one element is connected to another element by inference) includes direct and indirect connection between two items in the same manner as "connected to". As may be used herein, the terms "substantially" and "approximately" provide an industry-accepted tolerance for its corresponding term and/or relativity between items.

The various features of the disclosure described herein can be implemented in different systems and devices without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

In the foregoing specification, certain representative aspects of the invention have been described with reference to specific examples. Various modifications and changes may be made, however, without departing from the scope of the present invention as set forth in the claims. The specification and figures are illustrative, rather than restrictive, and modifications are intended to be included within the scope of the present invention. Accordingly, the scope of the invention should be determined by the claims and their legal equivalents rather than by merely the examples described. For example, the components and/or elements recited in any apparatus claims may be assembled or otherwise operationally configured in a variety of permutations and are accordingly not limited to the specific configuration recited in the claims.

Furthermore, certain benefits, other advantages and solutions to problems have been described above with regard to particular embodiments; however, any benefit, advantage, solution to a problem, or any element that may cause any particular benefit, advantage, or solution to occur or to become more pronounced are not to be construed as critical, required, or essential features or components of any or all the claims.

As used herein, the terms "comprise," "comprises," "comprising," "having," "including," "includes" or any variation thereof, are intended to reference a nonexclusive inclusion, such that a process, method, article, composition or apparatus that comprises a list of elements does not include only those elements recited, but may also include other elements not expressly listed or inherent to such process, method, article, composition, or apparatus. Other combinations and/or modifications of the above-described structures, arrangements, applications, proportions, elements, materials, or components used in the practice of the present invention, in addition to those not specifically recited, may be varied or otherwise particularly adapted to specific environments, manufacturing specifications, design parameters, or other operating requirements without departing from the general principles of the same.

Moreover, reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is intended to be construed under the provisions of 35 U.S.C. § 112(f) as a "means-plus-function" type element, unless the element is expressly recited using the phrase "means for" or, in the case of a method claim, the element is recited using the phrase "step for."

What is claimed is:

1. A data storage cooling module comprising:
    a fan cage assembly, the fan cage assembly including:
        a fan cage that includes at least one fan bay;
        at least one fan assembly removably coupled to the at least one fan bay, the fan assembly comprising a first fan module adjacent to a first end of the fan assembly and a second fan module adjacent to a second, opposing end of the fan assembly; and
    an interface board removably coupled to the fan cage assembly, with the first end of the fan assembly facing the interface board and the second end of the fan assembly facing away from the interface board to removably couple the first fan module to the interface board with the first fan module between the interface board and the second fan module, the interface board including:
        a first interface surface that includes at least one power connector configured to interface with the first fan module of the at least one fan assembly; and
        a second interface surface that includes at least one drive connector configured to interface with a baseboard.

2. The data storage cooling module of claim 1, wherein the fan cage includes:
    a first fan bay, wherein a first surface of the first fan bay includes two adjacent openings and a second surface of the first fan bay, which opposes the first surface of the first fan bay, includes two adjacent openings; and
    a second fan bay, wherein a first surface of the second fan bay includes two adjacent openings and a second surface of the second fan bay, which opposes the first surface of the second fan bay, includes two adjacent openings.

3. The data storage cooling module of claim 2, wherein the two adjacent openings of the first surface of the first fan bay, the two adjacent openings of the second surface of the first fan bay, the two adjacent openings of the first surface of the second fan bay, and the two adjacent openings of the second surface of the second fan bay are each circular openings.

4. The data storage cooling module of claim 2, wherein the two adjacent openings of the first surface of the first fan bay, the two adjacent openings of the second surface of the first fan bay, the two adjacent openings of the first surface of the second fan bay, and the two adjacent openings of the second surface of the second fan bay are each spaced apart by equal distances.

5. The data storage cooling module of claim 1, wherein the fan cage assembly includes:
a first fan assembly removably coupled to a first fan bay, the first fan assembly including the first and second fan modules, with the first and second fan modules of the first fan assembly adjacent to one another and aligned with two adjacent openings of the first fan bay; and
a second fan assembly removably coupled to a second fan bay, the second fan assembly including first and second fan modules, with the first and second fan modules of the second fan assembly adjacent to one another and aligned with adjacent openings of the second fan bay.

6. The data storage cooling module of claim 5, wherein the first fan bay and the first fan assembly are symmetric with the second fan bay and the second fan assembly.

7. The data storage cooling module of claim 5, wherein the interface board includes:
a first power connector and a second power connector mounted on the first interface surface;
wherein the first power connector connects to the first fan assembly and the second power connector connects to the second fan assembly; and
wherein the first power connector has a means for powering and controlling the first fan assembly and the second power connector has a means for powering and controlling the second fan assembly.

8. The data storage cooling module of claim 1, wherein the interface board includes:
a first drive connector and a second drive connector mounted on the second interface surface; and
wherein the first drive connector and the second drive connector have a means for interfacing with the baseboard.

9. The data storage cooling module of claim 1, wherein the interface board includes a series of circuits to carry signals between the at least one drive connector and the at least one power connector.

10. The data storage cooling module of claim 1, wherein the interface board is an industry standard hard drive disk (HDD) connector.

11. The data storage cooling module of claim 1, wherein the interface board is a U.3 drive connector, and wherein unused connector pins provide fan control and power to the at least one fan assembly.

12. The data storage cooling module of claim 1, wherein the interface board is capable of at least one of a small computer systems interface (SCSI) and a serial advanced technology attachment (SATA) drive connectivity.

13. The data storage cooling module of claim 1, wherein the at least one fan assembly is hot swappable.

14. The data storage cooling module of claim 1, wherein the fan cage assembly can be replaced with hard drives that connect to the interface board.

15. The data storage cooling module of claim 1, wherein the fan assembly is configured to provide power from the power connector of the first interface surface to both the first fan module and the second fan module of the fan assembly.

16. An interface board for a data storage cooling module comprising:
a first interface surface and a second interface surface that is opposite of the first interface surface;
a first power connector mounted on the first interface surface for powering either a first fan assembly or a first hard drive, with either the first fan assembly or the first hard drive, but not both, removably coupled to the first power connector;
a second power connector mounted on the first interface surface for powering either a second fan assembly or a second hard drive, with either the second fan assembly or the second hard drive, but not both, removably coupled to the second power connector; and
a first drive connector and a second drive connector mounted on the second interface surface for interfacing with a baseboard.

17. A data storage system comprising:
a data storage rack that includes a plurality of drive bays;
a baseboard that includes a plurality of drive connectors corresponding to the plurality of drive bays;
a data storage cooling module removably coupled to the data storage rack through a first subset of the plurality of drive connectors; and
a plurality of hard drives removably coupled to the data storage rack through a second subset of the plurality of drive connectors; and
wherein the data storage cooling module includes:
at least one fan assembly; and
an interface board removably coupled to the at least one fan assembly, with a first end of the fan assembly facing the interface board and a second end of the fan assembly facing away from the interface board, and with a first fan module of the fan assembly between the interface board and a second fan module of the fan assembly.

18. The data storage system of claim 17, wherein the data storage cooling module is removably coupled to the data storage rack via a latch.

19. The data storage system of claim 17, wherein the data storage cooling module occupies at least one drive bay without changing an infrastructure of the data storage system.

20. The data storage system of claim 17, wherein the plurality of hard drives are at least one of single-actuator hard drives and multi-actuator hard drives.

* * * * *